(12) United States Patent
Liu et al.

(10) Patent No.: US 9,276,622 B2
(45) Date of Patent: Mar. 1, 2016

(54) LOCAL OSCILLATOR (LO) GENERATOR WITH MULTI-PHASE DIVIDER AND PHASE LOCKED LOOP

(71) Applicant: QUALCOMM Incorporated, San Diego, CA (US)

(72) Inventors: Li Liu, San Diego, CA (US); Chiewcharn Narathong, Laguna Niguel, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 88 days.

(21) Appl. No.: 13/828,879

(22) Filed: Mar. 14, 2013

(65) Prior Publication Data
US 2014/0273904 A1    Sep. 18, 2014

(51) Int. Cl.
*H04B 1/16* (2006.01)
*H03L 7/18* (2006.01)
*H03L 7/099* (2006.01)

(52) U.S. Cl.
CPC .. *H04B 1/16* (2013.01); *H03L 7/18* (2013.01); *H03L 7/099* (2013.01)

(58) Field of Classification Search
CPC .......... H04B 1/16; H04B 12/006; H03L 7/18; H03L 7/089; H03L 7/099; H03L 7/093; H03L 7/0995; H03L 7/0891
USPC ......... 455/255, 246, 259, 260, 313, 314, 317, 455/318, 256, 257; 375/344, 355, 356, 375, 375/376
See application file for complete search history.

(56) References Cited

U.S. PATENT DOCUMENTS

| | | | |
|---|---|---|---|
| 5,014,061 A | | 5/1991 | Ghose |
| 5,761,615 A | * | 6/1998 | Jaffee ............................ 455/314 |
| 6,084,481 A | | 7/2000 | Westerman |
| 7,132,864 B1 | | 11/2006 | Ramsdsen |
| 8,744,380 B2 | * | 6/2014 | Wenink ......................... 455/313 |
| 2003/0203722 A1 | | 10/2003 | Karlquist et al. |
| 2006/0284657 A1 | | 12/2006 | Park et al. |
| 2009/0016477 A1 | | 1/2009 | Cramm et al. |
| 2009/0219099 A1 | | 9/2009 | Dubash et al. |

FOREIGN PATENT DOCUMENTS

GB            2281827 A        3/1995

OTHER PUBLICATIONS

International Search Report and Written Opinion—PCT/US2014/023667—ISA/EPO—Jun. 6, 2014.

* cited by examiner

*Primary Examiner* — Thanh Le
(74) *Attorney, Agent, or Firm* — Patterson & Sheridan, L.L.P.

(57) ABSTRACT

Techniques for generating a local oscillator (LO) signal are disclosed. In one design, an apparatus includes an oscillator, a divider, and a phase locked loop (PLL). The oscillator receives a control signal and provides an oscillator signal having a frequency determined by the control signal. The divider receives the oscillator signal and generates multiple divided signals of different phases. The PLL receives a reference signal and a selected divided signal and generates the control signal for the oscillator. The divider is powered on and off periodically and wakes up in one of multiple possible states, with each state being associated with a different phase of the selected divided signal. Phase continuity of the selected divided signal is ensured by using the divider in a feedback loop with the PLL. The PLL locks the selected divided signal to the reference signal, and the selected divided signal has continuous phase due to the reference signal having continuous phase.

27 Claims, 13 Drawing Sheets

LOCAL OSCILLATOR (LO) GENERATOR WITH MULTI-PHASE DIVIDER AND PHASE LOCKED LOOP

BACKGROUND

I. Field

The present disclosure relates generally to electronics, and more specifically to techniques for generating local oscillator (LO) signals used for frequency conversion.

II. Background

A wireless device (e.g., a cellular phone or a smart phone) may transmit and receive data for two-way communication with a wireless communication system. The wireless device may include a transmitter for data transmission and a receiver for data reception. For data transmission, the transmitter may modulate a transmit LO signal with data to obtain a modulated radio frequency (RF) signal, amplify the modulated RF signal to obtain an output RF signal having the proper transmit power level, and transmit the output RF signal via an antenna to a base station. For data reception, the receiver may obtain a received RF signal via the antenna, amplify and downconvert the received RF signal with a receive LO signal, and process the downconverted signal to recover data sent by the base station.

The wireless device may include LO generators to generate the transmit LO signal for the transmitter and the receive LO signal for the receiver. An LO signal is a periodic signal at a target frequency and may be used for frequency conversion. The LO generators may be operated non-continuously and may be powered on to generate LO signals only when needed in order to reduce power consumption. It may be desirable to support non-continuous operation of the LO generators.

SUMMARY

Techniques for generating an LO signal having continuous phase with an LO generator that is periodically powered on and off are disclosed herein. The LO signal may be generated by a divider within the LO generator. The divider may be periodically powered on and off and may wake up in one of multiple possible states, with each state being associated with a different phase of the LO signal.

In an aspect of the present disclosure, phase continuity of the LO signal may be ensured by using a multi-phase divider in a feedback loop with a phase locked loop (PLL). A multi-phase divider is a divider that receives an oscillator signal and generates a plurality of divided signals of different phases. The PLL may receive and lock a selected divided signal to a reference signal. The LO signal would then have continuous phase due to the reference signal having continuous phase and the selected divided signal being locked to the reference signal.

In an exemplary design, an apparatus (e.g., a wireless device or an integrated circuit) may include an oscillator, a divider, and a PLL. The oscillator may receive a control signal and provide an oscillator signal having a frequency determined by the control signal. The divider may receive the oscillator signal and generate a plurality of divided signals of different phases. The PLL may receive a reference signal and a selected divided signal among the plurality of divided signals and may generate the control signal for the oscillator. The apparatus may further include a downconverter that may downconvert an input RF signal with an LO signal generated based on at least one of the plurality of divided signals.

In an exemplary design, the divider may comprise a divide-by-two inphase-quadrature (I-Q) divider that can provide four divided signals that are 90 degrees out of phase. The PLL may receive the selected divided signal among the four divided signals. The divider may be (i) powered on prior to time intervals for downlink reception and (ii) powered off during at least part of time intervals for uplink transmission.

Various aspects and features of the disclosure are described in further detail below.

BRIEF DESCRIPTION OF THE DRAWINGS

FIG. 5 shows an LO signal having a non-continuous phase at power on.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Techniques for generating an LO signal with continuous phase by a non-continuous LO generator are disclosed herein. These techniques may be used for various electronic devices such as wireless communication devices.

Figure 1:
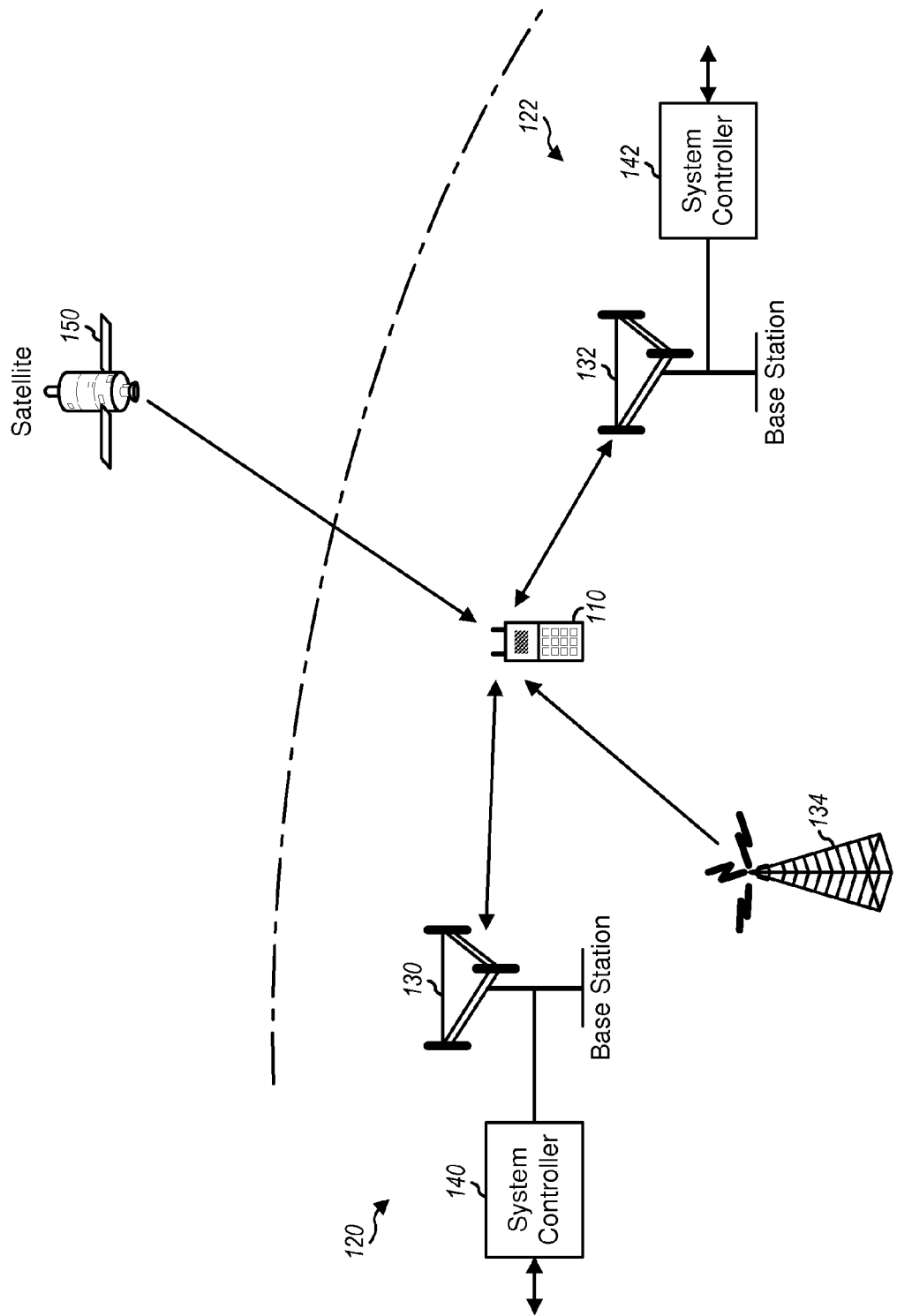
FIG. 1 shows a wireless device communicating with different wireless systems.

FIG. 1 shows a wireless device 110 capable of communicating with different wireless communication systems 120 and 122. Wireless systems 120 and 122 may each be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1X, Time Division Synchronous Code Division Multiple Access (TD-SCDMA), or some other version of CDMA. TD-SCDMA is also referred to as Universal Terrestrial Radio Access (UTRA) Time Division Duplex (TDD) 1.28 Mcps Option or Low Chip Rate (LCR). LTE supports both frequency division duplexing (FDD) and time division duplexing (TDD). For example, wireless system 120 may be an LTE system, and wireless system 122 may be a TD-SCDMA system. For simplicity, FIG. 1 shows wireless system 120 including one base station 130 and one system controller 140, and wireless system 122 including one base station 132 and one system controller 142. In general, each wireless system may include any number of base stations and any set of network entities. Each base station may support communication for wireless devices within its coverage.

Wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may be capable of communicating with wireless system 120 and/or 122. Wireless device 110 may also be capable of receiving signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, TD-SCDMA, WCDMA, CDMA 1x, GSM, 802.11, etc.

Figure 2:
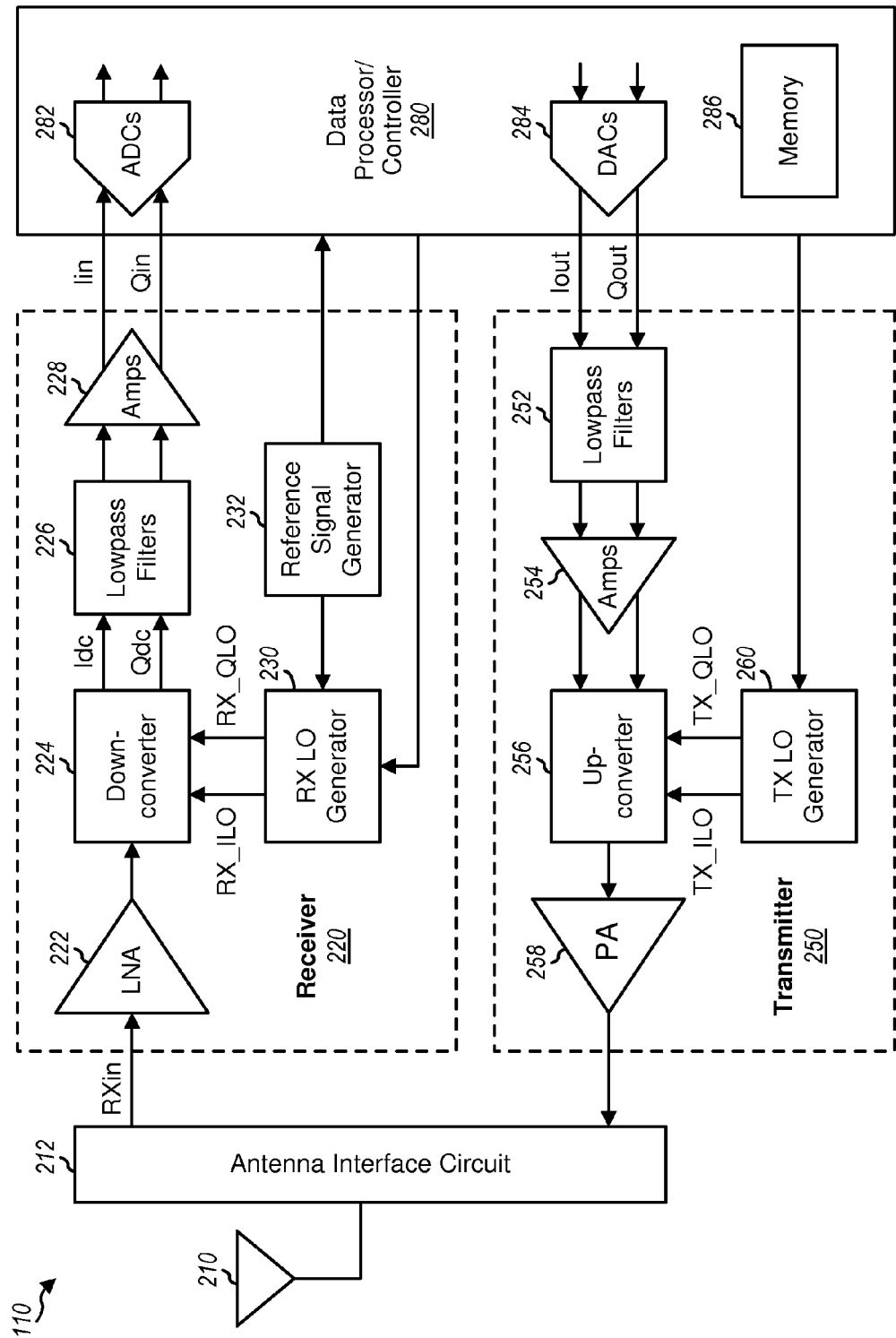
FIG. 2 shows a block diagram of the wireless device in FIG. 1.

FIG. 2 shows a block diagram of an exemplary design of wireless device 110 in FIG. 1. For simplicity, FIG. 2 shows wireless device 110 including one receiver 220 and one transmitter 250 for one antenna 210. In general, wireless device 110 may include any number of transmitters, any number of receivers, and any number of antennas to support communication for any number of radio technologies and any number of frequency bands.

A receiver or a transmitter may be implemented with a super-heterodyne architecture or a direct-conversion architecture. In the super-heterodyne architecture, a signal is frequency converted between RF and baseband in multiple stages, e.g., from RF to an intermediate frequency (IF) in one stage, and then from IF to baseband in another stage for a receiver. In the direct-conversion architecture, which is also referred to as a zero-IF (ZIF) architecture, a signal is frequency converted between RF and baseband in one stage. The super-heterodyne and direct-conversion architectures may use different circuit blocks and/or have different requirements. In the exemplary design shown in FIG. 2, receiver 220 and transmitter 250 are implemented with the direct-conversion architecture. The techniques described herein may be used for both the direct-conversion architecture and the super-heterodyne architecture.

In the receive path, antenna 210 receives downlink signals from base stations and/or other transmitter stations and provides an antenna output signal to an antenna interface circuit 212. Antenna interface circuit 212 routes (and possibly filters) the antenna output signal and provides a received RF signal (RXin) to receiver 220. Antenna interface circuit 212 may include switches, duplexers, diplexer, filters, matching circuits, etc.

Within receiver 220, a low noise amplifier (LNA) 222 amplifies the received RF signal and provides an input RF signal to a downconverter 224. Downconverter 224 also receives an LO signal from an LO generator 230. The LO signal comprises a receive inphase LO signal (RX_ILO) and a receive quadrature LO signal (RX_QLO), which are 90 degrees out of phase. Downconverter 224 downconverts the input RF signal from RF to baseband with the LO signal and provides inphase (I) and quadrature (Q) downconverted signals (Idc and Qdc). Lowpass filters 226 filter the I and Q downconverted signals and provide I and Q filtered signals. Amplifiers (Amps) 228 amplify the I and Q filtered signals and provide I and Q input baseband signals (Iin and Qin) to a data processor/controller 280. Lowpass filters 226 may include one lowpass filter for the I downconverted signal and another lowpass filter for the Q downconverted signal. Similarly, amplifiers 228 may include one amplifier for the I filtered signal and another amplifier for the Q filtered signal. Within data processor 280, analog-to-digital converters (ADCs) 282 digitize the I and Q input baseband signals and provide I and Q samples. Data processor 280 includes other circuits (not shown in FIG. 2) to digitally process the I and Q samples to recover data sent to wireless device 110.

LO generator 230 generates the receive LO signal for downconverter 224. LO generator 230 may include one or more voltage controlled oscillators (VCOs), PLLs, reference oscillators, dividers, buffers, etc. A reference signal generator 232 generates a reference signal at a reference frequency and provides the reference signal to data processor 280, LO generator 230, and/or other circuits.

In the transmit path, data processor 280 processes data to be transmitted and obtains I and Q chips. Digital-to-analog converters (DACs) 284 convert the I and Q chips to I and Q output baseband signals, which are provided to transmitter 250. Within transmitter 250, the I and Q output baseband signals are filtered by lowpass filters 252, amplified by amplifiers 254, and upconverted from baseband to RF by an upconverter 256 based on a transmit LO signal from an LO generator 260 to obtain a modulated RF signal. A power amplifier (PA) 258 amplifies the modulated RF signal and provides an output RF signal having the proper transmit power level. The output RF signal is routed through antenna interface circuit 212 and transmitted via antenna 210.

FIG. 2 shows an exemplary design of receiver 220 and transmitter 250. A transmitter and a receiver may also include other circuits not shown in FIG. 2, such as filters, matching circuits, etc. FIG. 2 also shows wireless device 110 including one receiver 220 and one transmitter 250. In general, a wireless device may include any number of receivers and any number of transmitters to support any number of frequency bands, any number of antennas, and any number of radio technologies. For example, wireless device 110 may include one or more receivers and one or more transmitters for each of low-band covering frequencies lower than 1000 megahertz (MHz), mid-band covering frequencies from 1000 MHz to 2300 MHz, and/or high-band covering frequencies higher than 2300 MHz. All or a portion of receiver 220 and transmitter 250 may be implemented on one or more RF ICs (RFICs), analog integrated circuits (ICs), mixed-signal ICs, etc. For example, all of the circuits within receiver 220 may be implemented on an RFIC.

Data processor/controller 280 may perform various functions for wireless device 110. For example, data processor 280 may perform processing for data being received via receiver 220 and data being transmitted via transmitter 250. Controller 280 may control the operation of various circuits in receiver 220 and transmitter 250. A memory 286 may store program codes and data for data processor/controller 280. Data processor/controller 280 may be implemented on one or more application specific integrated circuits (ASICs) and/or other ICs.

Figure 3:
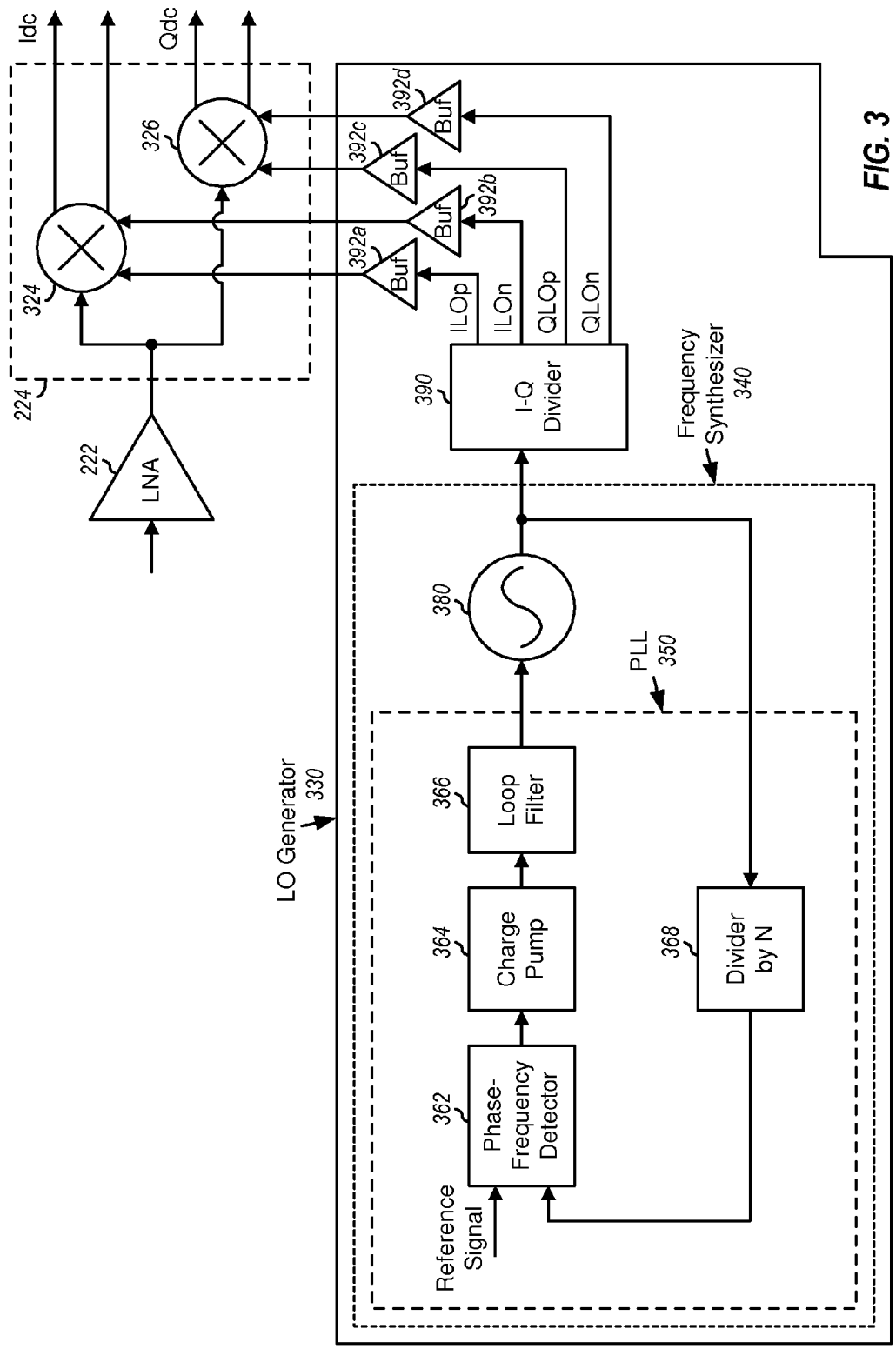
FIG. 3 shows a block diagram of an LO generator.

FIG. 3 shows a block diagram of an LO generator 330, which may be used for LO generator 230 or 260 in FIG. 2. LO generator 330 includes a frequency synthesizer 340, a divider 390, and buffers (Buf) 392a to 392d. Frequency synthesizer 340 includes a PLL 350 and a VCO 380. Frequency synthesizer 340 generates a VCO signal at a desired frequency. Divider 390 divides the VCO signal in frequency and provides an LO signal.

Within PLL 350, a phase-frequency detector 362 receives a reference signal and a feedback signal from a divider 368, compares the phases of the two signals, and provides a detector output signal that indicates the phase difference/error between the reference signal and the feedback signal. A charge pump 364 receives the detector output signal and generates an error signal that is proportional to the detected phase error. A loop filter 366 filters the error signal and provides a control signal for VCO 380. VCO 380 generates a VCO signal having a frequency determined based on the control signal. Loop filter 366 adjusts the control signal such that the phase of the feedback signal is locked to the phase of the reference signal. Divider 368 divides the VCO signal by a factor of N and provides the feedback signal. The divider factor N may be an integer or non-integer value.

In the design shown in FIG. 3, divider 390 divides the VCO signal in frequency and provides four divided signals comprising ILOp, ILOn, QLOp and QLOn signals, which are 90 degrees out of phase with respect to each other. Buffers 392a to 392d buffer the four divided signals and provide an LO signal comprising an ILO signal and a QLO signal, which are 90 degrees out of phase. The ILO signal is a differential signal comprising the buffered ILOp and ILOn signals, which are 180 degrees out of phase. The QLO signal is a differential signal comprising the buffered QLOp and QLOn signals, which are 180 degrees out of phase. In general, a differential signal comprises a non-inverting signal denoted by a suffix "p" and an inverting signal denoted by a suffix "n". The ILO signal may be provided to a mixer 324 within downconverter 224. The QLO signal may be provided to a mixer 326 within downconverter 224.

Figure 4:
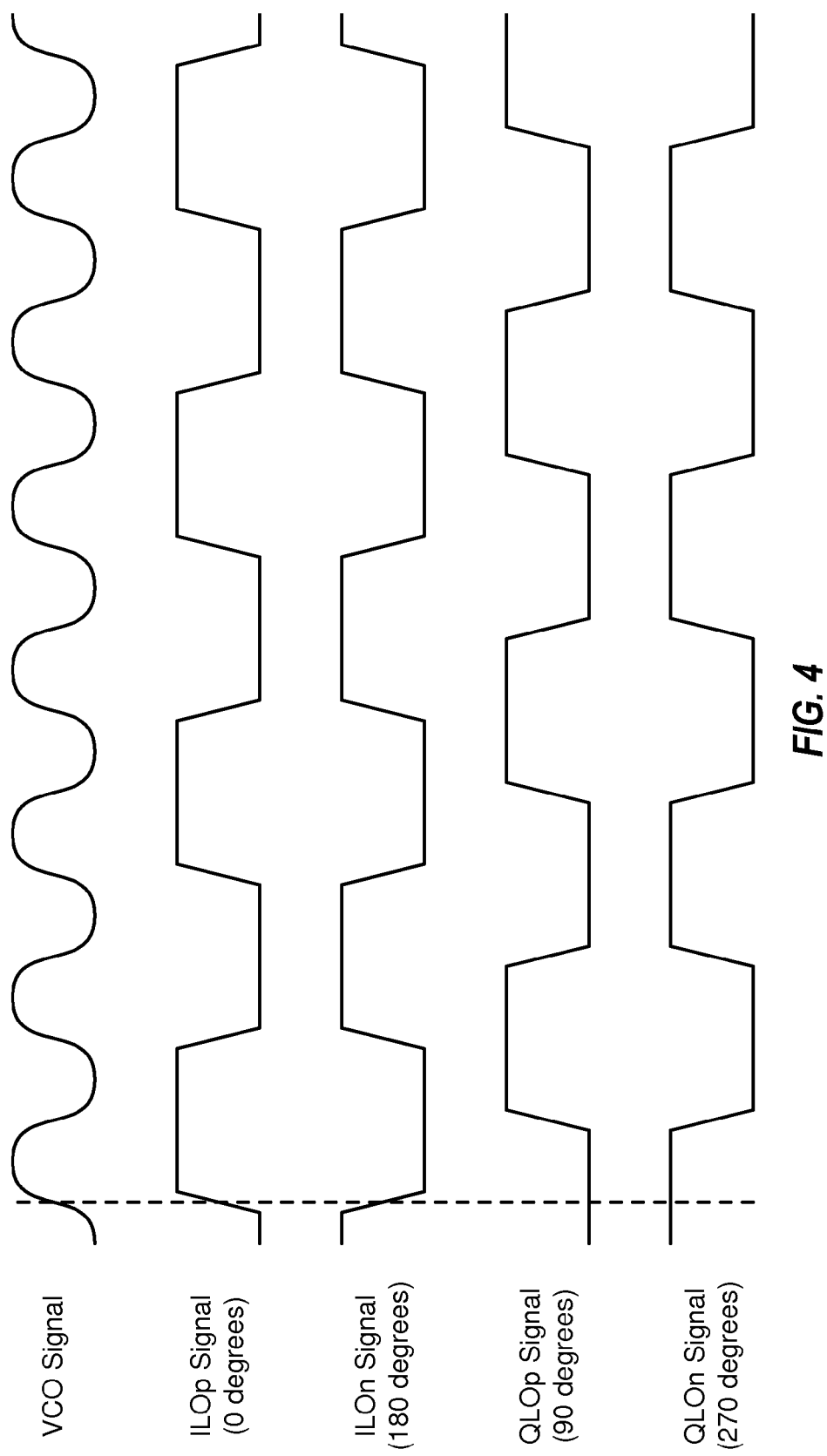
FIG. 4 shows divided signals of different phases from an I-Q divider.

FIG. 4 shows the VCO signal and the ILOp, ILOn, QLOp and QLOn signals for a case in which divider 390 is a divide-by-2 I-Q divider. In this case, the ILOp, ILOn, QLOp and QLOn signals are at half the frequency of the VCO signal. Furthermore, the QLOp signal is delayed by 90 degrees (or one half cycle of the VCO signal) relative to the ILOp signal.

In another design, divider 390 may divide the VCO signal in frequency by a fixed divider ratio (e.g., two) and provide a divided VCO signal. In yet another exemplary design, divider 390 may operate in one of multiple modes at any given moment. Divider 390 may operate as a quadrature divider and may generate four divided signals (e.g., the ILOp, ILOn, QLOp and QLOn signals) in a first mode. Divider 390 may operate as a divide-by-L divider and may generate one or more divided signals in a second mode.

Wireless device 110 may communicate with a base station in a wireless system via the downlink and uplink. The downlink (or forward link) refers to the communication link from the base station to the wireless device. The uplink (or reverse link) refers to the communication link from the wireless device to the base station.

Wireless device 110 may support communication with wireless systems utilizing TDD and/or FDD. For TDD, the downlink and uplink share the same frequency, and downlink transmissions and uplink transmissions may be sent on the same frequency in different time periods. For FDD, the downlink and uplink are allocated separate frequencies. Downlink transmissions may be sent on one frequency, and uplink transmissions may be sent on another frequency. Some exemplary radio technologies supporting TDD include LTE TDD, TD-SCDMA, and GSM. Some exemplary radio technologies supporting FDD include LTE FDD, WCDMA, and CDMA 1x.

When communicating with a wireless system utilizing TDD, wireless device 110 may power on/up the circuitry in receiver 220 only during receive (RX) time and may power off/down the receiver circuitry during non-RX time in order to conserve battery power. The RX time may cover time periods designated for the downlink and may cover just time periods that wireless device 110 needs to receive downlink signals. The non-RX time may cover all remaining time periods that are not part of the RX time. For example, wireless device 110 may power on LO generator 230 during RX time and may power off LO generator 230 during non-RX time. LO generator 230 may thus operate in a non-continuous manner.

As shown in FIG. 3, LO generator 230 may include (i) frequency synthesizer 340 to generate the VCO signal at a suitable RF frequency and (ii) divider 390 to generate the LO signal. Frequency synthesizer 340 may be locked to the reference signal having a continuous phase and may thus generate the VCO signal having a continuous phase even though frequency synthesizer 340 may be continually powered on and off. However, divider 390 may power up in one of a set of possible states. For example, divider 390 may be a divide-by-2 divider and may arbitrarily wake up in either state '0' or '1' when it is powered on. The state of divider 390 depends on which edge (e.g., rising or falling edge) of an incoming VCO signal triggers divider 390 when divider 390 wakes up. Generally, a wake-up signal of a divider may not be timed or synchronized with a VCO signal in order to save battery power and reduce complexity of the divider. If a divide-by-2 divider misses one VCO edge (or one cycle), then the absolute phase of the divide-by-2 divider output is shifted by 180°. Divider 390 may generate ILO and QLO signals having a first phase if it wakes up in state '0' and may generate the ILO and QLO signals having a second phase if it wakes up in state '1'. The ILO and QLO signals may then have non-continuous phase, which may be undesirable or unacceptable.

Figure 5:
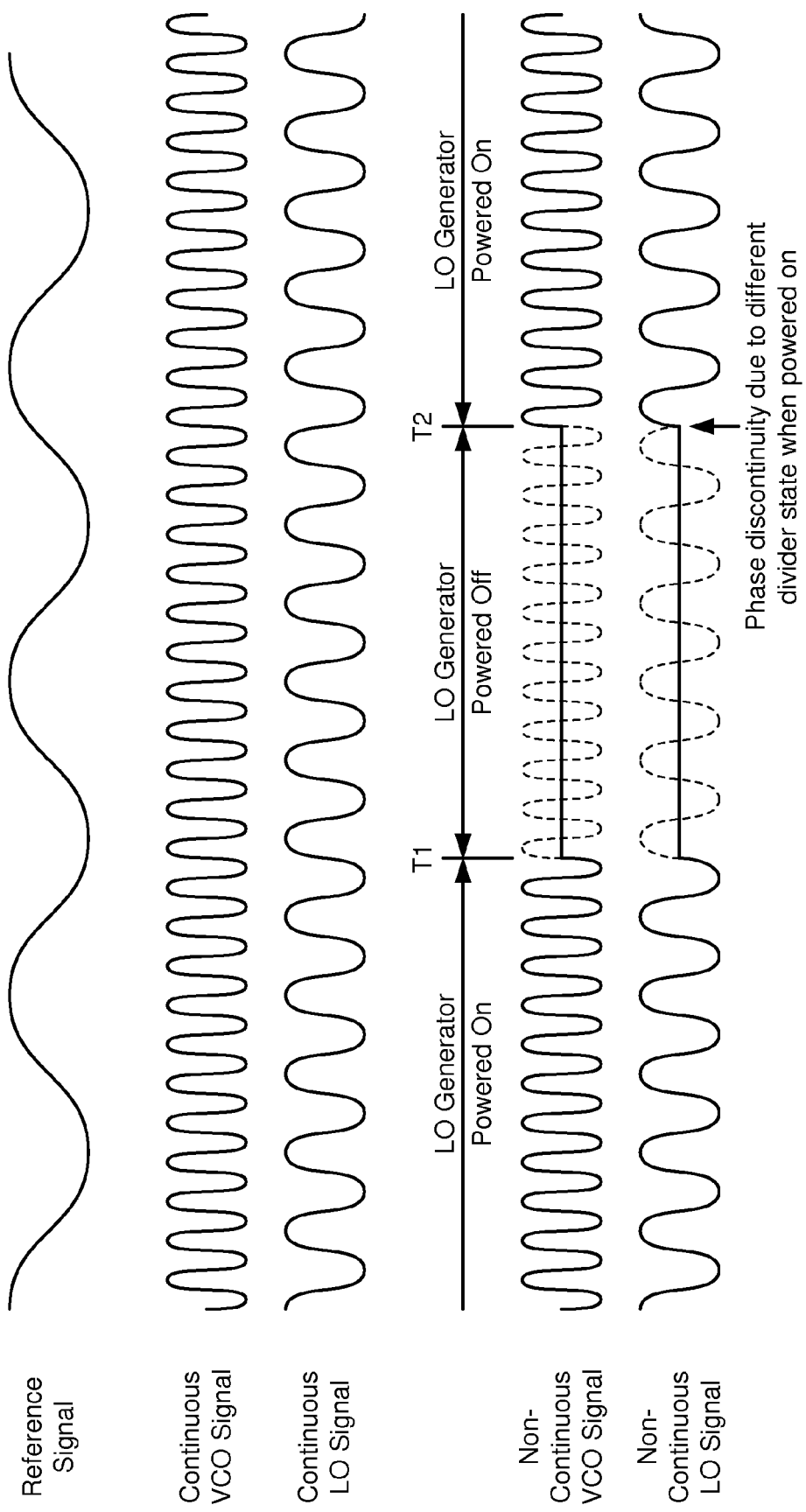

FIG. 5 shows a plurality of signals including an LO signal having a non-continuous phase due to a divider waking up in a different state when powered up. A reference signal having a continuous phase is shown at the top of FIG. 5 and may be generated by reference signal generator 232 in FIG. 2, which may be powered on all the time. A continuous VCO signal may be generated by a first frequency synthesizer that is powered on all the time. A non-continuous VCO signal may be generated by a second frequency synthesizer that is periodically powered on and off. The non-continuous VCO signal may have continuous phase when the second frequency synthesizer is locked to the reference signal having continuous phase.

A continuous LO signal may be generated by dividing the continuous VCO signal and may have continuous phase. A non-continuous LO signal may be generated by a divider that divides the non-continuous VCO signal in frequency. The divider may operate in a first state (e.g., state '0') prior to being powered off at time T1 and may operate in a second state (e.g., state '1') after being powered on at time T2. Different states of the divider may be associated with different I-Q relationship of the ILO and QLO signals. The non-continuous LO signal may then have phase discontinuity at time T2 due to the divider being at a different state at time T2. In particular, the non-continuous LO signal may have a first phase prior to time T1 and a second phase after time T2, with the second phase being different from the first phase.

An LO signal provided to downconverter 224 in FIG. 2 should have continuous phase over time (i.e., have no phase discontinuity) in order to properly downconvert an RF signal. Phase continuity may be achieved by powering on a frequency synthesizer and a divider all the time. However, significant battery power may be wasted to power on the frequency synthesizer and the divider, even when they are not needed for data reception during uplink subframes, just to maintain phase continuity of the LO signal.

In an aspect of the present disclosure, an LO signal having continuous phase may be generated by using a multi-phase divider (which generates the LO signal for a downconverter or an upconverter) in a feedback loop with a PLL. The divider may be a divide-by-two I-Q divider that generates four divided signals that are in quadrature with one another, e.g., as shown in FIG. 3. The divider may also be an I-Q divider with other divider ratio that generates multiple divided signals of different phases.

The techniques described herein may enable a frequency synthesizer and a divider to generate an LO signal having continuous phase even when these circuits are periodically powered on and off in order to conserve battery power. The techniques may be used for an LO generator for a receiver as well as an LO generator for a transmitter. For clarity, various details of the techniques are described below for LO generator 230 for receiver 220 in FIG. 2.

Figure 6A:
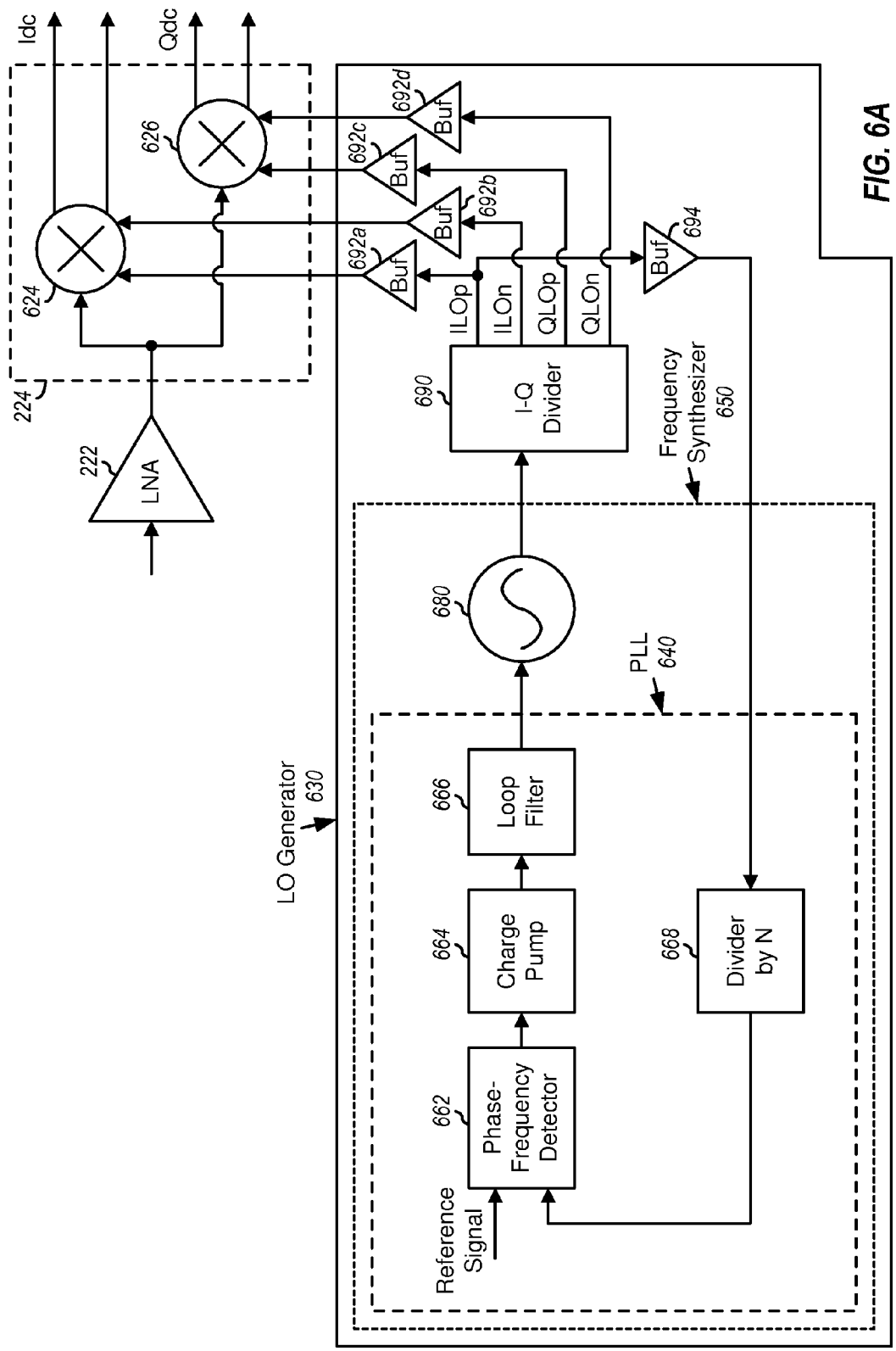
FIGS. 6A to 6C show three exemplary designs of an LO generator that can generate an LO signal having continuous phase.

FIG. 6A shows a block diagram of an exemplary design of an LO generator 630 that can generate an LO signal having continuous phase even when LO generator 630 is powered on and off periodically. LO generator 630 may be used for LO generator 230 or 260 in FIG. 2. LO generator 630 includes a frequency synthesizer 640, a divider 690, and buffers 692a to 692d, which are coupled in similar manner as frequency synthesizer 340, divider 390, and buffers 392a to 392d, respectively, in FIG. 3. Frequency synthesizer 640 includes a PLL 650 and a VCO 680, which are coupled in similar manner as PLL 350 and VCO 380 in FIG. 3.

In the exemplary design shown in FIG. 6, PLL 650 includes a phase-frequency detector 662, a charge pump 664, a loop filter 666, and a divider 668, which are coupled in similar manner as phase-frequency detector 362, charge pump 364, loop filter 366, and divider 368, respectively, in FIG. 3. Divider 690 divides a VCO signal from VCO 680 by a factor of M, where M may be 2, 3, 4 or some other value. Divider 690 provides four divided signals comprising ILOp, ILOn, QLOp and QLOn signals, which are 90 degrees out of phase with respect to each other. Buffers 692a to 692d buffer the four divided signals and provide an ILO signal and a QLO signal, which have a known phase relationship, e.g., as shown in FIG. 4. Buffer 694 receives a selected divided signal from divider 690, buffers the selected divided signal, and provides a buffered divided signal to divider 668. The selected divided signal may be the ILOp signal, as shown in FIG. 6A, or some other divided signal provided by divider 690. Dummy buffers, such as buffer 694, may be placed in the signal paths for the ILOn, QLOp and QLOn signals so that divider 690 observes similar loading for the ILOp, ILOn, QLOp and QLOn signals.

Divider 690 is located outside of PLL 650 and may also be referred to as an LO divider. Divider 668 is part of PLL 650 and may also be referred to as a programmable PLL divider (or an N-divider). PLL divider 668 may be an integer-N divider or a fractional-N divider. PLL divider 668 may comprise a dual-modulus or multi-modulus prescaler and frequency counters, which may generate mode control signals to control the divider ratio of the prescaler. PLL divider 668 may not need I/Q input or output. PLL divider 668 may typically receive a single phase output from a VCO and generate a single output signal for a phase-frequency detector, which may typically be single ended.

In the exemplary design shown in FIG. 6A, both dividers 668 and 690 are located within a feedback loop of PLL 650. PLL 650 generates a control signal for VCO 680 such that the phase of a feedback signal from PLL divider 668 is locked to the phase of the reference signal. Since the ILOp signal from LO divider 690 is provided to PLL divider 668, PLL 650 generates the control signal such that the phase of the ILOp signal is locked to the phase of the reference signal. The ILOp signal would then have continuous phase (even though LO generator 630 is periodically powered on and off) due to PLL 650 locking the phase of the ILOp signal to the continuous phase of the reference signal. The initial wake up state of PLL divider 668 or LO divider 690 may not matter, since PLL 650 will eventually lock to the reference signal. If divider 690 wakes up in an undesired state, then it may simply take PLL 650 more time to settle to the phase of the reference signal.

In general, a divider used to generate an LO signal may have any number of possible states and may generate any number of divided signals of different phases. For example, the divider may be a divide-by-two I-Q divider that generates four divided signals that are in quadrature with one another, as shown in FIG. 6A. The divider may also be an I-Q divider with other divider ratio that generates multiple divided signals having different phases. In any case, one divided signal may be selected from among the multiple divided signals outputted by the divider. The selected divided signal may be fed back to a PLL and locked to a reference signal having continuous phase. The selected divided signal would then have continuous phase. The other divided signals would each have a known phase relative to the phase of the selected divided signal due to the design of the divider.

Figure 6B:
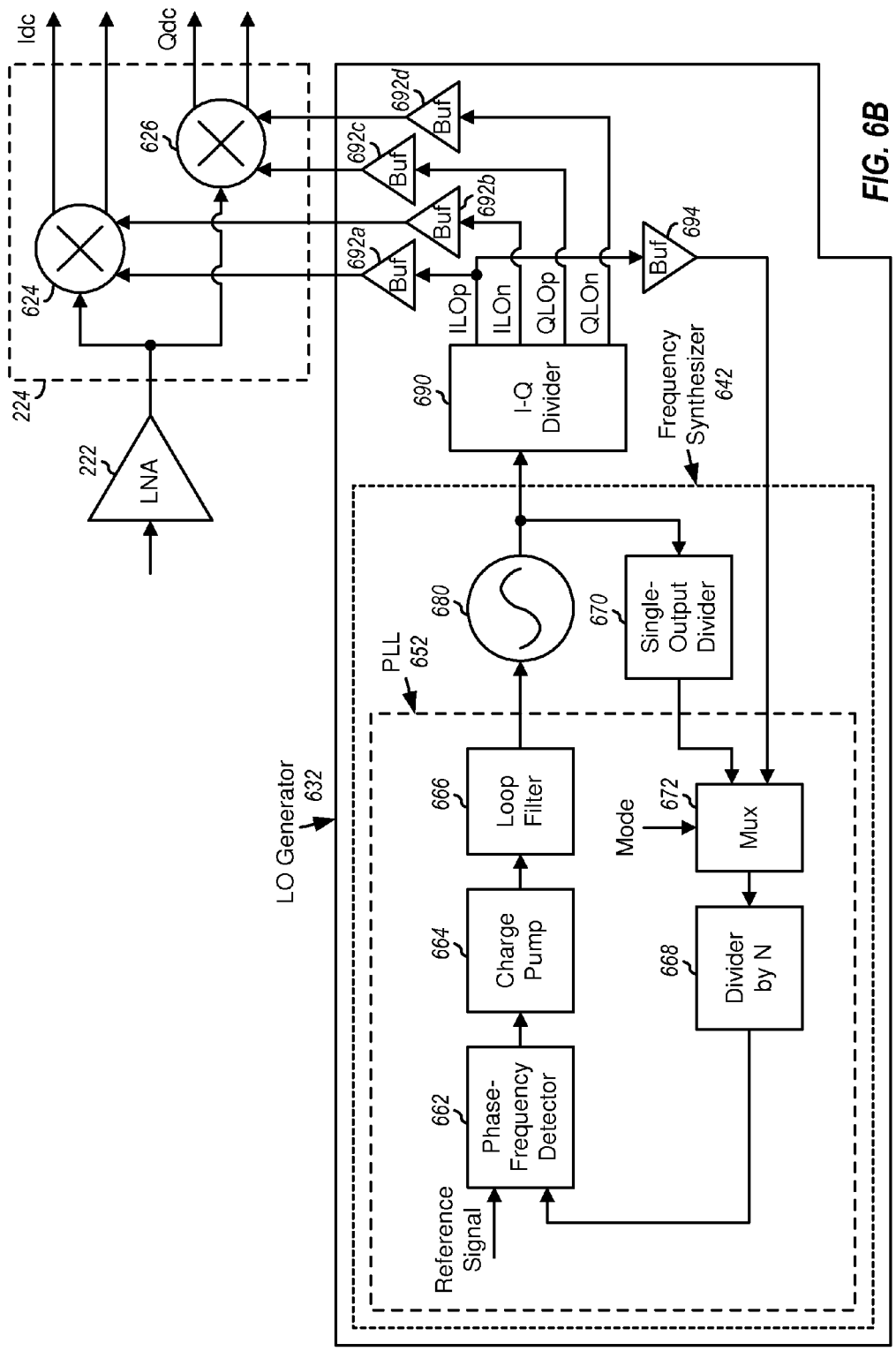

FIG. 6B shows a block diagram of an exemplary design of an LO generator 632 that can generate an LO signal having continuous phase even when LO generator 632 is powered on and off periodically. LO generator 632 may also be used for LO generator 230 or 260 in FIG. 2. LO generator 632 includes a frequency synthesizer 642, divider 690, and buffers 692a to 692d and 694, which are coupled as described above for FIG. 6A. Frequency synthesizer 642 includes a PLL 652, VCO 680, and a divider 670. PLL 652 and VCO 680 are coupled in similar manner as PLL 350 and VCO 380 in FIG. 3.

In the exemplary design shown in FIG. 6B, PLL 652 includes phase-frequency detector 662, charge pump 664, loop filter 666, and divider 668, which are coupled as described above for FIG. 6A. PLL 652 further includes a multiplexer (Mux) 672. Divider 670 receives a VCO signal from VCO 680, divides the VCO signal in frequency by a factor of L, and provides a first divided signal to a first input of multiplexer 672. L may be equal to 2, 3, 4, or some other value. Buffer 694 receives and buffers a selected divided signal (e.g., the ILOp signal) from divider 690 and provides a second divided signal to a second input of multiplexer 672. Multiplexer 672 provides the first or second divided signal to divider 668 based on a mode control signal.

In one design, LO generator 632 may operate in either a continuous mode or a non-continuous mode, which may be indicated by the mode control signal. In the continuous mode, the VCO signal may be divided by divider 670, routed through multiplexer 672, and provided to divider 668. Divider 670 may provide a single divided signal and ease the frequency operation range requirement of PLL divider 668. Divider 670 may be bypassed when divider 668 can directly operate at the VCO frequency. Buffer 694 may be powered off in the continuous mode. Divider 690 may be powered on to provide an LO signal for the downconverter in continuous mode. In the non-continuous mode, the ILOp signal from buffer 694 may be routed through multiplexer 672 and provided to divider 668. The use of the ILOp signal in the feedback loop of PLL 652 may enable LO generator 632 to generate the ILOp signal with continuous phase even though LO generator 632 may be periodically powered on and off. Divider 670 may be powered off in the non-continuous mode. The continuous mode may be selected for use when LO generator 632 is powered on continuously or when an LO signal with continuous phase is not required. The non-continuous mode may be selected for use when continuous phase is required and LO generator 632 is periodically powered on and off.

In one design, VCO 680 may drive multiple LO dividers for multi-band and/or multi-mode applications. The multiple LO dividers may include LO divider 690 and at least one additional LO divider not shown in FIG. 6B. The multiple LO dividers may be physically separated and/or may have different divider ratios. Since an LO divider, an LNA, and a mixer may be physically separated for each band, instead of feeding back different LO divider outputs to a PLL, it may be advantageous to have a common divider for the PLL itself (which may correspond to divider 670 in FIG. 6B). A common locked VCO signal from VCO 680 may be routed to different LO dividers in multi-band and/or multi-mode applications in the continuous mode.

Figure 6C:
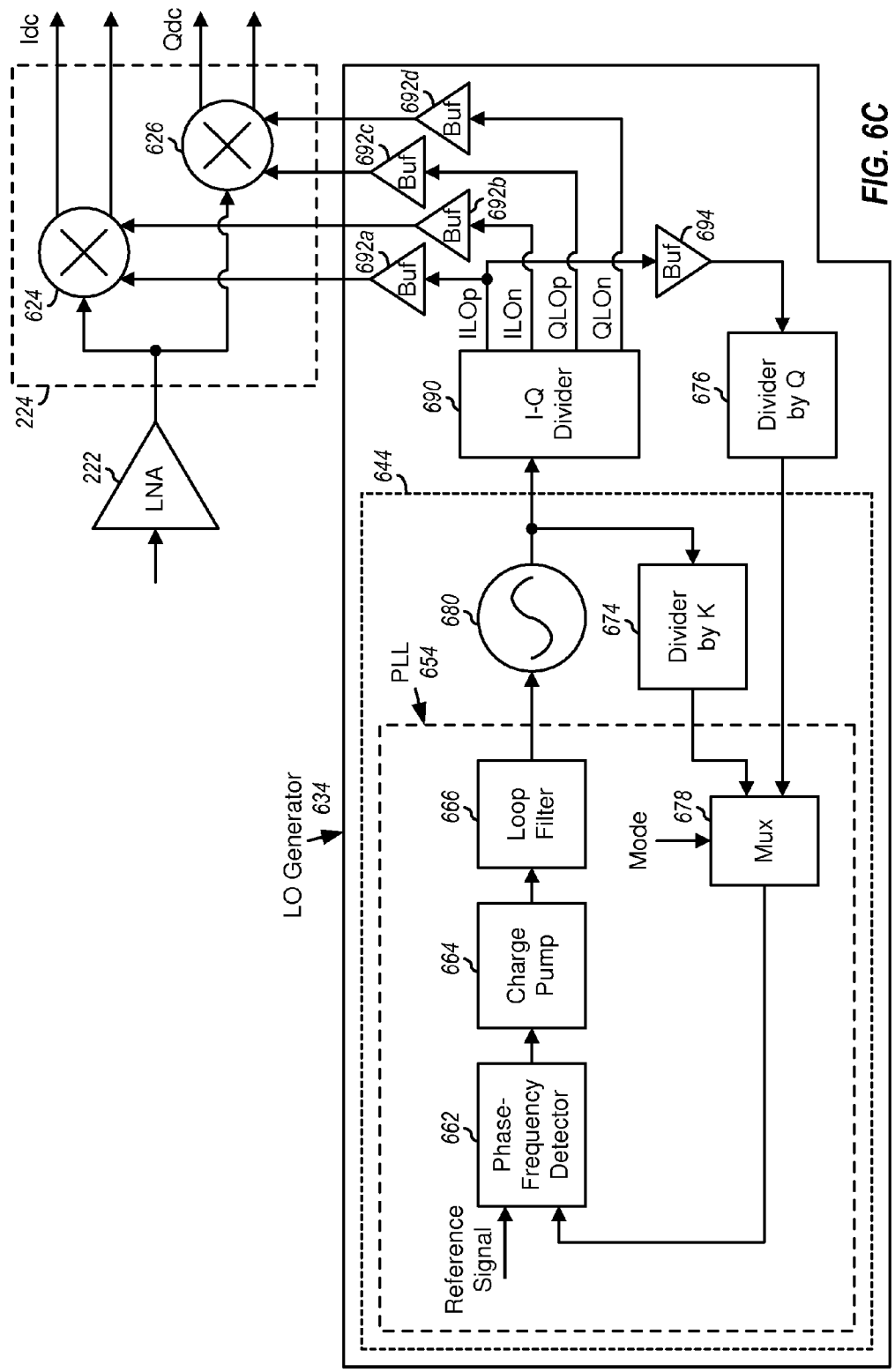

FIG. 6C shows a block diagram of an exemplary design of an LO generator 634 that can generate an LO signal having continuous phase even when LO generator 634 is powered on and off periodically. LO generator 634 may also be used for LO generator 230 or 260 in FIG. 2. LO generator 634 includes a frequency synthesizer 644, divider 690, and buffers 692a to 692d and 694, which are coupled as described above for FIG. 6A. Frequency synthesizer 644 includes a PLL 654, VCO 680, and a divider 674. PLL 644 and VCO 680 are coupled in similar manner as PLL 350 and VCO 380 in FIG. 3.

In the exemplary design shown in FIG. 6C, PLL 654 includes phase-frequency detector 662, charge pump 664, and loop filter 666, which are coupled as described above for FIG. 6A. PLL 654 further includes a multiplexer 678. Divider 674 receives a VCO signal from VCO 680, divides the VCO signal in frequency by a factor of K, and provides a first divided signal to a first input of multiplexer 678. K may be any integer or non-integer value. Divider 676 receives a selected divided signal from buffer 694, divides the selected divided signal by a factor of Q, and provides a second divided signal to a second input of multiplexer 678. Multiplexer 678 provides the first or second divided signal to phase-frequency detector 662 based on a mode control signal.

In one design, LO generator 634 may operate in either a continuous mode or a non-continuous mode, which may be indicated by the mode control signal. In the continuous mode, the VCO signal may be divided by divider 674, routed through multiplexer 672, and provided to phase-frequency detector 662. Dividers 676 and buffer 694 may be powered off in the continuous mode. In the non-continuous mode, the ILOp signal from buffer 694 may be divided in frequency by divider 676, routed through multiplexer 678, and provided to phase-frequency detector 662. The use of the ILOp signal in the feedback loop of PLL 654 may enable LO generator 634 to generate the ILOp signal with continuous phase even though LO generator 634 may be periodically powered on and off. Divider 674 may be powered off in the non-continuous mode.

In the design shown in FIG. 6C, separate dividers 674 and 676 are used for the continuous mode and the non-continuous mode. Divider 674 may be located close to VCO 680 in order to shorten routing traces of the VCO signal from VCO 680 to divider 674, which may reduce power dissipation and improve performance. Divider 676 may be located close to divider 690 in order to shorten routing traces of the ILOp signal from divider 690 and buffer 694 to divider 676.

FIGS. 6A to 6C show three exemplary designs of an LO generator in which a divided signal from an LO divider is used in a feedback loop of a PLL to ensure a continuous phase for the divided signal. An LO generator that can generate an LO signal with continuous phase may also be implemented in other manners. For example, a VCO may be replaced with an oscillator of some other type such as a current controlled oscillator (ICO), etc. A PLL may also be implemented in other manners and may include different and/or additional circuits not shown in FIGS. 6A to 6C.

Figure 7:
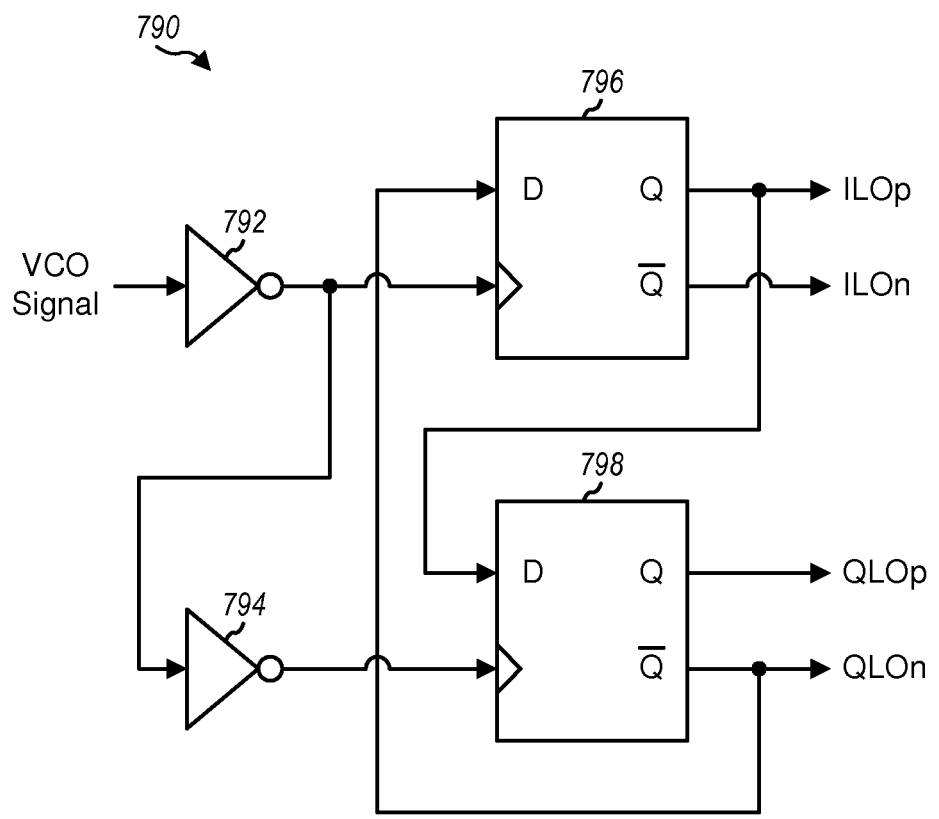
FIG. 7 shows an exemplary design of an I-Q divider.

FIG. 7 shows a schematic diagram of an exemplary design of a divide-by-two I-Q divider 790, which may be used for divider 390 in FIG. 3 or divider 690 in FIGS. 6A to 6C. Divider 790 includes two D flip flops 796 and 798 that are cross-coupled. Flip flop 796 has its Q output coupled to a D input of flip flop 798. Flip flop 798 has its $\overline{Q}$ output coupled to a D input of flip flop 796. An inverter 792 has its input receiving a VCO signal and its output coupled to a clock input of flip flop 796. An inverter 794 has its input coupled to the output of inverter 792 and its output coupled to a clock input of flip flop 798. Flip flop 796 provides ILOp and ILOn signals from its Q and $\overline{Q}$ outputs, respectively. Flip flop 798 provides QLOp and QLOn signals from its Q and $\overline{Q}$ outputs, respectively.

Flip flops 796 and 798 are clocked by falling and rising edges, respectively, of the VCO signal due to inverter 794. Hence, the Q and $\overline{Q}$ outputs of flip flop 798 transition one half VCO signal cycle after the Q and $\overline{Q}$ outputs of flip flop 796.

When flip flop 796 is powered on, the Q output may initially provide a logic high or a logic low depending on whether flip flop 796 wakes up in state '0' or '1'. Flip flop 798 clocks in the logic value on the Q output of flip flop 796 one half VCO signal cycle later and provides the clocked logic value at its Q output. The QLOp signal from the Q output of flip flop 798 is thus a delayed version of the ILOp signal from the Q output of flip flop 796. Flip flop 796 clocks in the logic value on the $\overline{Q}$ output of flip flop 798 at the next VCO signal cycle. Flip flop 796 toggles between logic high and logic low on alternating VCO signal cycles in order to implement divide by two.

FIG. 7 shows an exemplary design of an I-Q divider that may be used to generate multiple divided signals of different phases for an LO signal. A divider generating multiple divided signals of different phases may also be implemented in other manners with other circuits.

The techniques described herein for generating an LO signal with continuous phase may be used for wireless devices communicating with various wireless systems utilizing TDD. For example, the techniques may be used for wireless devices in LTE TDD systems, TD-SCDMA systems, etc. Different wireless systems may utilize different frame structures to support TDD.

Figure 8A:
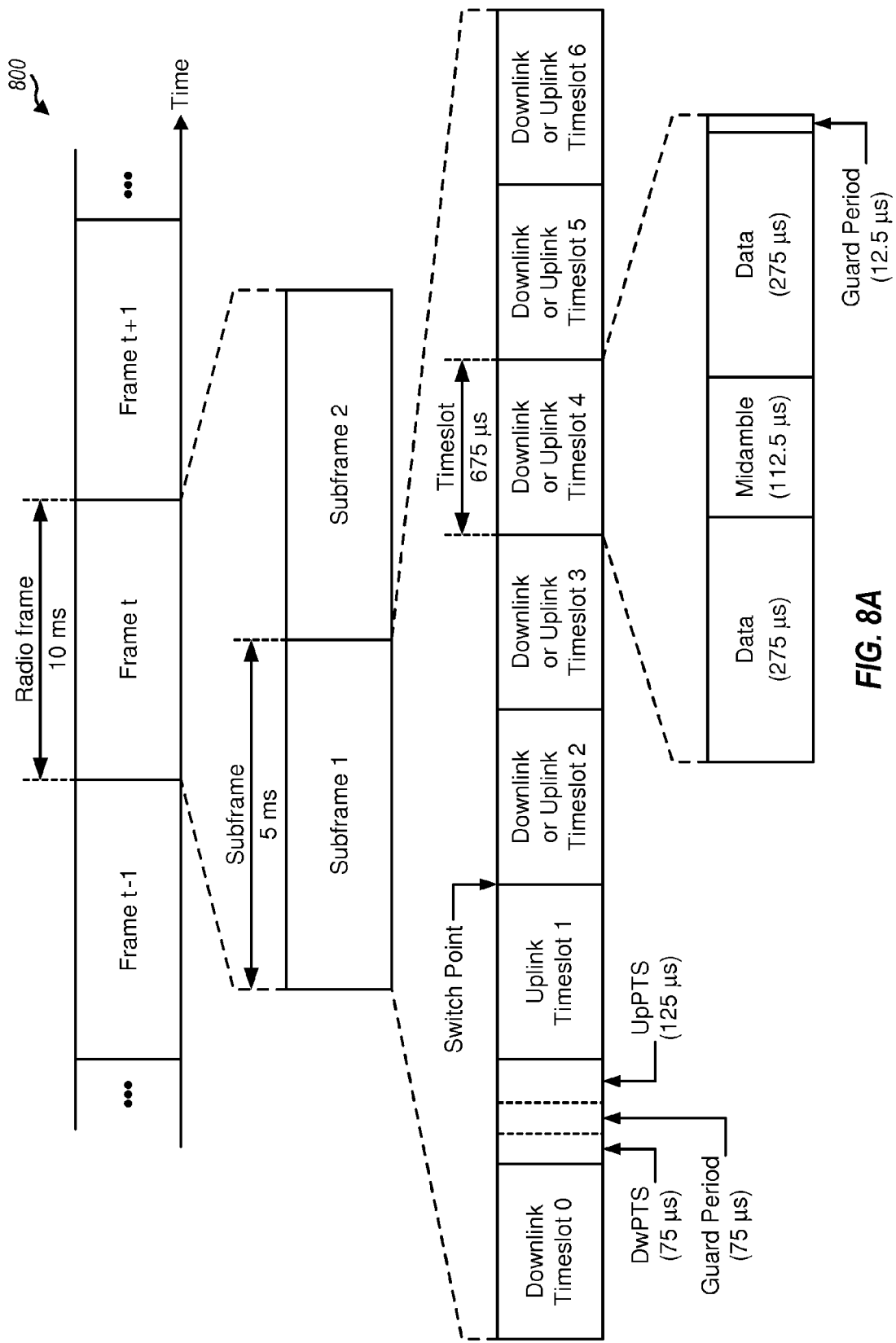
FIGS. 8A and 8B show two exemplary frame structures.

FIG. 8A shows an exemplary frame structure 800 for TD-SCDMA. The transmission time line is partitioned into frames, with each frame being identified by a system frame number (SFN). Each frame has a duration of 10 milliseconds (ms) and is partitioned into two subframes 1 and 2. Each subframe has a duration of 5 ms and is partitioned into seven timeslots 0 through 6, a Downlink Pilot Time Slot (DwPTS), an Uplink Pilot Time Slot (UpPTS), and a guard period (GP). The DwPTS, the guard period, and the UpPTS are located after timeslot 0. Timeslot 0 is used for the downlink, timeslot 1 is used for the uplink, and timeslots 2 through 6 may each be used for the downlink and/or uplink, as determined by a switch point. Each timeslot has a duration of 675 microsecond (µs). The DwPTS has a duration of 75 µs, and the UpPTS has a duration of 125 µs. The guard period is located between the DwPTS and the UpPTS and has a duration of 75 µs.

For TD-SCDMA, each timeslot includes a first data portion, a midamble, a second data portion, and a guard period.

Each data portion has a duration of 275 μs, and the midamble has a duration of 112.5 μs. The guard period is located at the end of the timeslot and has a duration of 12.5 μs. Each timeslot may be assigned to one or multiple users for data transmission.

Figure 8B:
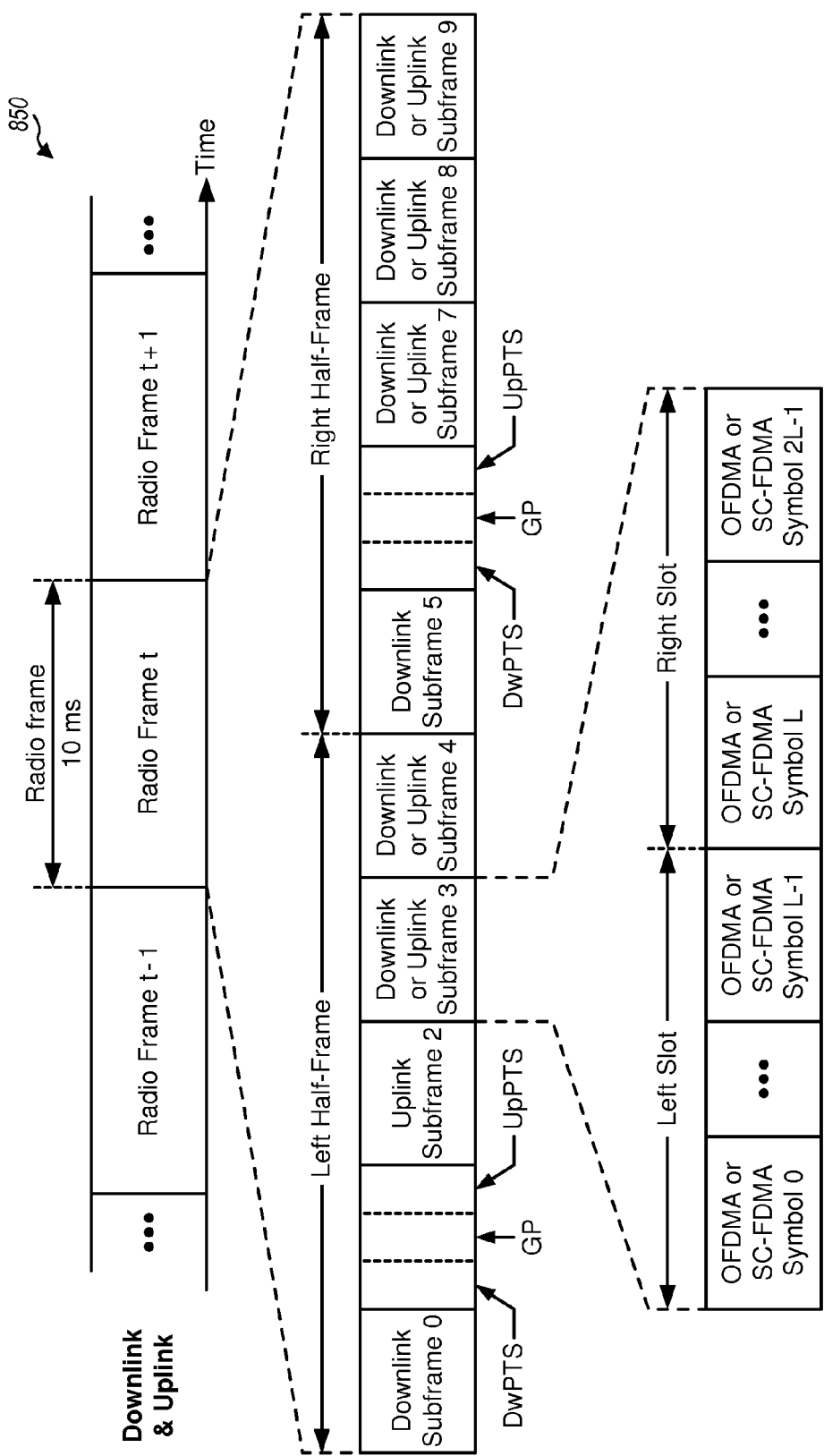

FIG. 8B shows an exemplary frame structure 850 for LTE TDD. The transmission timeline is partitioned into units of radio frames, with each radio frame having a duration of 10 ms. Each radio frame is partitioned into 10 subframes with indices of 0 through 9. LTE supports a number of uplink-downlink configurations for TDD. Subframes 0 and 5 are used for the downlink and subframe 2 is used for the uplink for all uplink-downlink configurations. Subframes 3, 4, 7, 8 and 9 may each be used for the downlink or uplink depending on the uplink-downlink configuration. Subframe 1 includes three special fields composed of a DwPTS, a Guard Period (GP), and an UpPTS. Subframe 6 may include only the DwPTS, or all three special fields, or a downlink subframe depending on the uplink-downlink configuration. The DwPTS, the guard period, and the UpPTS may have different durations for different subframe configurations. The DwPTS may have a duration between 214 and 857 μs. The UpPTS may have a duration between 71 and 142 μs. The guard period may have a duration between 71 and 714 μs.

As shown in FIGS. 8A and 8B, TD-SCDMA systems and LTE TDD systems have fast switching between downlink timeslots and uplink timeslots. For example, within a subframe in a TD-SCDMA system shown in FIG. 8A, downlink-to-uplink transition occurs within the 75 μs guard period after timeslot 0, and uplink-to-downlink transition occurs within the 12.5 μs guard period at the end of a timeslot.

In TDD systems, some subframes may be used for the downlink and may be referred to as downlink subframes. The remaining subframes may be used for the uplink and may be referred to as uplink subframes. Wireless device 110 may disable as much receiver circuitry as possible during uplink subframes in order to conserve battery power. Wireless device 110 may also disable as much transmitter circuitry as possible during downlink subframes in order to conserve battery power.

As shown in FIGS. 8A and 8B, a receiver may be active during only some time intervals, and a transmitter may be active during other time intervals for communication with a wireless system utilizing TDD. For example, the receiver may be active during downlink timeslots a TD-SCDMA system or downlink subframes in an LTE TDD system. The transmitter may be active during uplink timeslots a TD-SCDMA system or uplink subframes in an LTE TDD system. To conserve battery power and possibly improve performance, LO generator 230 may be enabled only when the receiver is active and may be disabled at other times.

Figure 9:
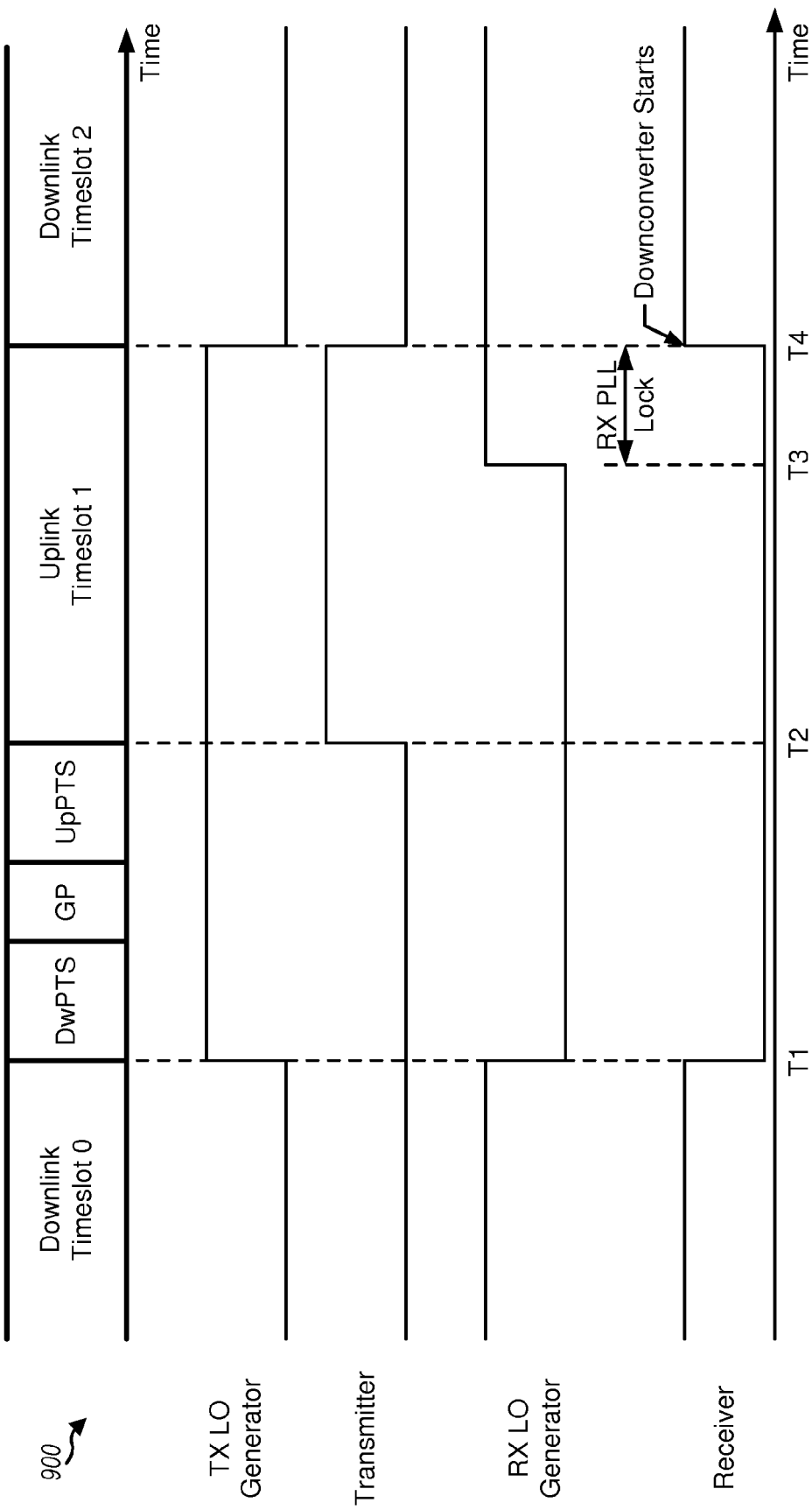
FIG. 9 shows an exemplary timeline for powering on and off LO generators.

FIG. 9 shows an exemplary timeline 900 for powering on and off RX LO generator 230 and TX LO generator 260 in wireless device 110 in FIG. 2 for TD-SCDMA. For data transmission on the uplink, TX LO generator 260 is (i) enabled at the start of the DwPTS at time T1 and (ii) disabled at the end of timeslot 1 for the uplink at time T4. Transmitter 250 is (i) enabled prior to the start of timeslot 1 at time T2 and (ii) disabled at the end of timeslot 1 for the uplink at time T4.

For data reception on the downlink, RX LO generator 230 is (i) disabled at the end of timeslot 0 for the downlink at time T1 and (ii) enabled prior to the start of timeslot 2 for the downlink at time T3. RX LO generator 230 attempts to lock to the reference signal starting at time T3 and achieves lock at time T4. Receiver 220 is (i) disabled at the end of timeslot 0 for the downlink at time T1 and (ii) enabled prior to the start of timeslot 2 for the downlink at time T4. As shown in FIG. 9, RX LO generator 230 may be powered on during downlink subframes to generate the LO signal for data reception. RX LO generator 230 may be powered off during uplink subframes.

In an exemplary design, an apparatus (e.g., a wireless device, an IC, a circuit module, etc.) may include an oscillator, a divider, and a PLL. The oscillator (e.g., VCO 680 in FIGS. 6A to 6C) may receive a control signal and provide an oscillator signal (e.g., a VCO signal) having a frequency determined by the control signal. The divider (e.g., divider 690) may receive the oscillator signal and generate a plurality of divided signals of different phases. The PLL (e.g., PLL 650, 652 or 654 in FIG. 6A, 6B or 6C) may receive a reference signal and a selected divided signal among the plurality of divided signals and may generate the control signal for the oscillator. The apparatus may further comprise a downconverter (e.g., downconverter 224) that may downconvert an input RF signal with an LO signal generated based on at least one of the plurality of divided signals.

In an exemplary design, the divider may generate the plurality of divided signals comprising four divided signals that are 90 degrees out of phase. For example, the divider may comprise a divide-by-two I-Q divider that can provide four divided signals that are 90 degrees out of phase. The PLL may receive the selected divided signal among the four divided signals. The divider may be in one of a plurality of possible states upon being powered on. The plurality of possible states of the divider may be associated with different phases of the selected divided signal when the divider is powered on. The use of the selected divided signal in the feedback loop of the PLL may ensure that the selected divided signal has continuous phase regardless of the state of the divider when it is powered on.

In an exemplary design, the apparatus may further comprise a second divider (e.g., divider 670 in FIG. 6B or divider 674 in FIG. 6C), which may receive the oscillator signal and generate a second divided signal. The PLL may generate the control signal based on the selected divided signal from the divider or the second divided signal from the second divider.

In an exemplary design shown in FIG. 6C, the PLL may comprise a multiplexer and a phase-frequency detector. The multiplexer (e.g., multiplexer 678 in FIG. 6C) may receive the selected divided signal from the divider and the second divided signal from the second divider and may provide either the selected divided signal or the second divided signal. The phase-frequency detector (e.g., detector 662) may receive the reference signal and the selected divided signal or the second divided signal from the multiplexer and may provide a detector output signal used to generate the control signal.

In an exemplary design shown in FIG. 6B, the PLL may comprise a multiplexer, a third divider, and a phase-frequency detector. The multiplexer (e.g., multiplexer 672 in FIG. 6B) may receive the selected divided signal from the divider and the second divided signal from the second divider and may provide the selected divided signal or the second divided signal. The third divider (e.g., divider 668) may receive the selected divided signal or the second divided signal from the multiplexer and may provide a third divided signal. The phase-frequency detector (e.g., detector 662) may receive the reference signal and the third divided signal and may provide a detector output signal used to generate the control signal.

In an exemplary design, the divider may be (i) powered on prior to time intervals for downlink reception and (ii) powered off during at least part of time intervals for uplink transmission. In an exemplary design, the divider may be selected to generate a non-continuous LO signal, and the second divider may be selected to generate a continuous LO signal. In one design, the oscillator may be periodically powered on and off, and the oscillator signal may have continuous phase. The oscillator signal may also have a phase that is synchronized to a downlink signal from a wireless system, which may require synchronized operation by a wireless device.

Figure 10:
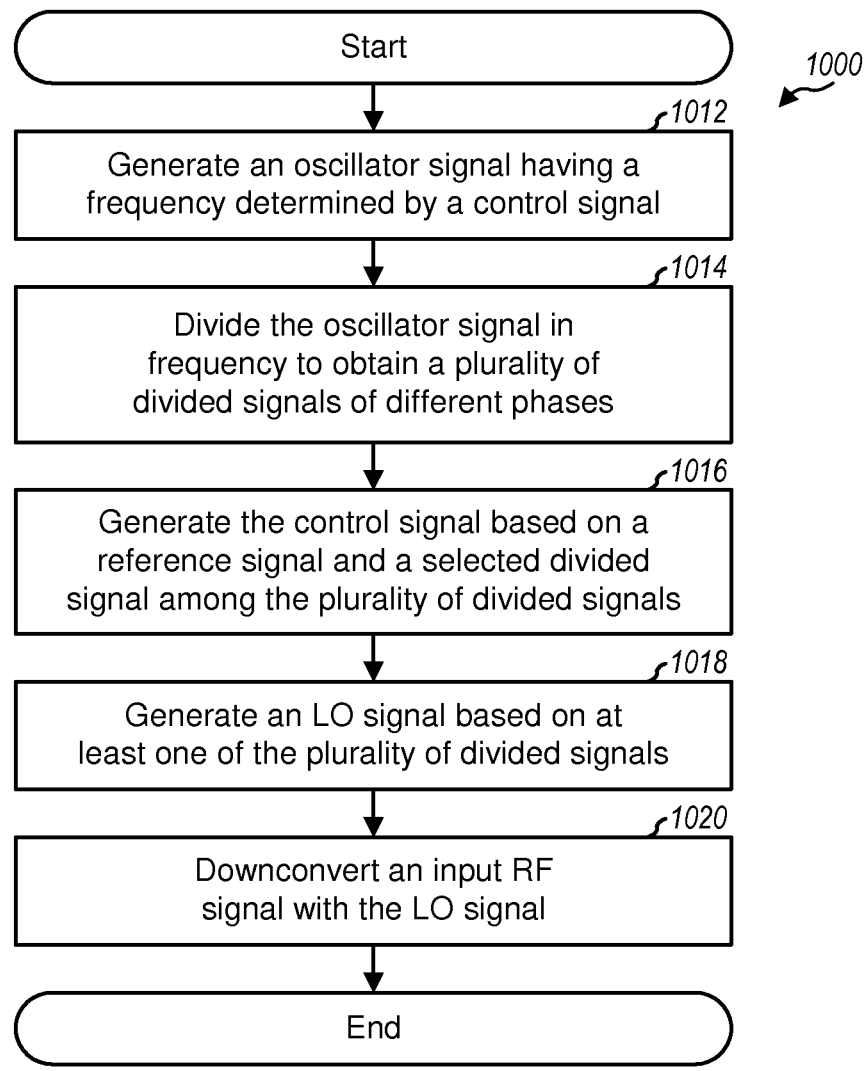
FIG. 10 shows a process for generating an LO signal.

FIG. 10 shows an exemplary design of a process 1000 for generating an LO signal. An oscillator signal having a frequency determined by a control signal may be generated (e.g., by VCO 680 in FIGS. 6A to 6C) (block 1012). The oscillator signal may be divided in frequency (e.g., by divider 690 in FIGS. 6A to 6C) to obtain a plurality of divided signals of different phases (block 1014). The control signal may be generated (e.g., by PLL 640, 642 or 644 in FIG. 6A, 6B or 6C, respectively) based on a reference signal as well as a selected divided signal among the plurality of divided signals (block 1016). An LO signal may be generated based on at least one of the plurality of divided signals (block 1018). An input RF signal may be downconverted with the LO signal (block 1020).

In one design of block 1014, the oscillator signal may be divided in frequency to obtain four divided signals that are 90 degrees out of phase. The selected divided signal may be one of the four divided signals.

In one design, a divider used to generate the plurality of divided signals may be operated non-continuously. For example, the divider may be powered on prior to time intervals for downlink reception and may be powered off during at least part of time intervals for uplink transmission.

In one design, a second divided signal may be generated based on the oscillator signal (e.g., by divider 670 or 674). The control signal may be generated based on the selected divided signal or the second divided signal. In one design that is shown in FIG. 6C, phase error between a reference signal and the selected divided signal or the second divided signal may be detected, e.g., as shown in FIG. 6C. The control signal may be generated based on the detected phase error. In another design that is shown in FIG. 6B, the selected divided signal or the second divided signal may be divided in frequency to obtain a third divided signal. Phase error between the reference signal and the third divided signal may be detected. The control signal may then be generated based on the detected phase error.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. An apparatus comprising:
an oscillator configured to receive a control signal and provide an oscillator signal having a frequency determined by the control signal;
a divider configured to receive the oscillator signal and generate a plurality of divided signals of different phases; and
a phase-locked loop (PLL) configured to receive a reference signal and a selected divided signal among the plurality of divided signals and to generate the control signal for the oscillator, wherein the divider is periodically powered on and off and wherein the selected divided signal has continuous phase.

2. The apparatus of claim 1, wherein the plurality of divided signals generated by the divider comprise four divided signals that are 90 degrees out of phase, and wherein the PLL is configured to receive the selected divided signal among the four divided signals.

3. The apparatus of claim 1, wherein the divider comprises a divide-by-two inphase-quadrature divider providing four divided signals that are 90 degrees out of phase.

4. The apparatus of claim 1, wherein the divider wakes up in one of a plurality of possible states upon being powered on, and wherein the plurality of possible states of the divider are associated with different phases of the selected divided signal when the divider is powered on.

5. The apparatus of claim 1, wherein the divider is configurable to divide the oscillator signal by a predetermined divider ratio.

6. The apparatus of claim 1, further comprising:
a downconverter configured to downconvert an input radio frequency (RF) signal with a local oscillator (LO) signal generated based on at least one of the plurality of divided signals.

7. The apparatus of claim 1, wherein the divider is powered on prior to time intervals for downlink reception and is powered off during at least part of time intervals for uplink transmission.

8. The apparatus of claim 1, wherein the oscillator signal has a phase that is synchronized to a downlink signal from a wireless system.

9. An apparatus comprising:
an oscillator configured to receive a control signal and provide an oscillator signal having a frequency determined by the control signal;
a divider configured to receive the oscillator signal and generate a plurality of divided signals of different phases;
a phase-locked loop (PLL) configured to receive a reference signal and a selected divided signal among the plurality of divided signals and to generate the control signal for the oscillator; and
a second divider configured to receive the oscillator signal and generate a second divided signal, wherein the PLL is configured to generate the control signal based on the reference signal and the selected divided signal from the divider or the second divided signal from the second divider.

10. The apparatus of claim 9, the PLL comprising:
a multiplexer configured to receive the selected divided signal from the divider and the second divided signal from the second divider and to provide the selected divided signal or the second divided signal, and
a phase-frequency detector configured to receive the reference signal and the selected divided signal or the second divided signal from the multiplexer and to provide a detector output signal used to generate the control signal.

11. The apparatus of claim 9, the PLL comprising:
a multiplexer configured to receive the selected divided signal from the divider and the second divided signal from the second divider and to provide the selected divided signal or the second divided signal,
a third divider configured to receive the selected divided signal or the second divided signal from the multiplexer and to provide a third divided signal, and
a phase-frequency detector configured to receive the reference signal and the third divided signal and to provide a detector output signal used to generate the control signal.

12. The apparatus of claim 9, wherein the divider is selected to generate a non-continuous local oscillator (LO) signal, and wherein the second divider is selected to generate a continuous LO signal.

13. A method comprising:
generating, by an oscillator, an oscillator signal having a frequency determined by a control signal;
dividing, by a divider, the oscillator signal in frequency to obtain a plurality of divided signals of different phases; and
generating the control signal based on a reference signal and a selected divided signal among the plurality of divided signals, wherein the divider is periodically powered on and off and wherein the selected divided signal has continuous phase.

14. The method of claim 13, wherein the dividing the oscillator signal comprises dividing the oscillator signal in frequency to obtain four divided signals that are 90 degrees out of phase, and wherein the selected divided signal is one of the four divided signals.

15. The method of claim 13, further comprising:
generating a local oscillator (LO) signal based on at least one of the plurality of divided signals; and
downconverting an input radio frequency (RF) signal with the LO signal.

16. The method of claim 13, further comprising:
generating the plurality of divided signals with a divider;
powering on the divider prior to time intervals for downlink reception; and
powering off the divider during at least part of time intervals for uplink transmission.

17. A method comprising:
generating an oscillator signal having a frequency determined by a control signal;
dividing the oscillator signal in frequency to obtain a plurality of divided signals of different phases;
generating a second divided signal based on the oscillator signal; and
generating the control signal based on a reference signal and the selected divided signal among the plurality of divided signals or the second divided signal.

18. The method of claim 17, wherein the generating the control signal based on the selected divided signal or the second divided signal comprises
detecting phase error between a reference signal and the selected divided signal or the second divided signal, and
generating the control signal based on the detected phase error.

19. The method of claim 17, wherein the generating the control signal based on the selected divided signal or the second divided signal comprises
    dividing the selected divided signal or the second divided signal in frequency to obtain a third divided signal,
    detecting phase error between a reference signal and the third divided signal, and
    generating the control signal based on the detected phase error.

20. An apparatus comprising:
    means for generating an oscillator signal having a frequency determined by a control signal;
    means for dividing the oscillator signal in frequency to obtain a plurality of divided signals of different phases; and
    means for generating the control signal based on a reference signal and a selected divided signal among the plurality of divided signals, wherein the means for dividing the oscillator signal is periodically powered on and off and wherein the selected divided signal has continuous phase.

21. The apparatus of claim 20, wherein the means for dividing the oscillator signal comprises means for dividing the oscillator signal in frequency to obtain four divided signals that are 90 degrees out of phase, and wherein the selected divided signal is one of the four divided signals.

22. The apparatus of claim 20, further comprising:
    means for generating a local oscillator (LO) signal based on at least one of the plurality of divided signals; and
    means for downconverting an input radio frequency (RF) signal with the LO signal.

23. The apparatus of claim 20, further comprising:
    means for powering on the means for dividing the oscillator signal prior to time intervals for downlink reception; and
    means for powering off the means for dividing the oscillator signal during at least part of time intervals for uplink transmission.

24. An apparatus comprising:
    means for generating an oscillator signal having a frequency determined by a control signal;
    means for dividing the oscillator signal in frequency to obtain a plurality of divided signals of different phases;
    means for generating a second divided signal based on the oscillator signal; and
    means for generating the control signal based on a reference signal and a selected divided signal among the plurality of divided signals or the second divided signal.

25. The apparatus of claim 24, wherein the means for generating the control signal based on the selected divided signal or the second divided signal comprises
    means for detecting phase error between a reference signal and the selected divided signal or the second divided signal, and
    means for generating the control signal based on the detected phase error.

26. The apparatus of claim 24, wherein the means for generating the control signal based on the selected divided signal or the second divided signal comprises
    means for dividing the selected divided signal or the second divided signal in frequency to obtain a third divided signal,
    means for detecting phase error between a reference signal and the third divided signal, and
    means for generating the control signal based on the detected phase error.

27. A non-transitory computer-readable medium comprising:
    code for causing at least one processor to direct generation, by an oscillator, of an oscillator signal having a frequency determined by a control signal;
    code for causing the at least one processor to direct generation, by a divider, of a plurality of divided signals of different phases based on the oscillator signal; and
    code for causing the at least one processor to direct generation of the control signal based on a reference signal and a selected divided signal among the plurality of divided signals, wherein the divider is periodically powered on and off and wherein the selected divided signal has continuous phase.

* * * * *